United States Patent
Slaughter et al.

(10) Patent No.: US 7,095,646 B2
(45) Date of Patent: Aug. 22, 2006

(54) MULTI-STATE MAGNETORESISTANCE RANDOM ACCESS CELL WITH IMPROVED MEMORY STORAGE DENSITY

(75) Inventors: Jon M. Slaughter, Tempe, AZ (US); Leonid Savtchenko, deceased, late of Chandler, AZ (US); by Anatoli A. Korkin, legal representative, Gilbert, AZ (US); Herbert Goronkin, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 217 days.

(21) Appl. No.: 10/198,203

(22) Filed: Jul. 17, 2002

(65) Prior Publication Data

US 2004/0012994 A1    Jan. 22, 2004

(51) Int. Cl.
    *G11C 11/00*    (2006.01)
(52) U.S. Cl. ............... 365/158; 365/171; 365/173
(58) Field of Classification Search ............. 365/158, 365/171, 173
    See application file for complete search history.

(56) References Cited

U.S. PATENT DOCUMENTS

| | | | |
|---|---|---|---|
| 3,707,706 A | 12/1972 | Kefalas | |
| 5,764,567 A * | 6/1998 | Parkin | 365/173 |
| 6,114,719 A | 9/2000 | Dill et al. | |
| 6,127,045 A * | 10/2000 | Gill | 428/611 |
| 6,169,689 B1 | 1/2001 | Naji | |
| 6,314,020 B1 | 11/2001 | Hansen et al. | |
| 6,341,053 B1 * | 1/2002 | Nakada et al. | 360/324.2 |
| 6,633,498 B1 * | 10/2003 | Engel et al. | 365/158 |

FOREIGN PATENT DOCUMENTS

| | | |
|---|---|---|
| EP | 0962939 A1 | 12/1999 |
| EP | 0971424 A2 | 1/2000 |
| WO | WO0004551 | 1/2000 |

OTHER PUBLICATIONS

Zheng et al, Multilevel Magnetoresistive Random Access Memory Written at Curie Point, Data Storage Institute, IEEE 2002.

* cited by examiner

*Primary Examiner*—Son T. Dinh
(74) *Attorney, Agent, or Firm*—Ingrassia, Fisher & Lorenz, P.C.

(57) ABSTRACT

A multi-state magnetoresistive random access memory device having a pinned ferromagnetic region with a magnetic moment vector fixed in a preferred direction in the absence of an applied magnetic field, an non-ferromagnetic spacer layer positioned on the pinned ferromagnetic region, and a free ferromagnetic region with an anisotropy designed to provide a free magnetic moment vector within the free ferromagnetic region with N stable positions, wherein N is a whole number greater than two, positioned on the non-ferromagnetic spacer layer. The number N of stable positions can be induced by a shape anisotropy of the free ferromagnetic region wherein each N stable position has a unique resistance value.

29 Claims, 2 Drawing Sheets

MULTI-STATE MAGNETORESISTANCE RANDOM ACCESS CELL WITH IMPROVED MEMORY STORAGE DENSITY

This invention was made with Government support under Agreement No. MDA972-96 -3-0016 awarded by DARPA. The Government has certain rights in the invention.

FIELD OF THE INVENTION

This invention relates to semiconductor memory devices and, more particularly, the present invention relates to semiconductor random access memory devices that utilize a magnetic field.

BACKGROUND OF THE INVENTION

Traditional semiconductor memory devices store a memory state by storing an electronic charge. However, magnetoresistive random access memory (hereinafter referred to as "MRAM") devices store a memory state by utilizing the direction of the magnetic moment vector created in a magnetic material or structure. Thus, a memory state in a MRAM device is not maintained by power, but rather by the direction of the magnetic moment vector. To be commercially viable, however, MRAM must have comparable memory density to current memory technologies, be scalable for future generations, operate at low voltages, have low power consumption, and have competitive read/write speeds.

In previous MRAM technology, storing data is accomplished by applying magnetic fields and causing a magnetic material in a MRAM device to be magnetized into either of two possible memory states. Thus, a single MRAM device typically stores one bit of information and to increase the memory density, the MRAM device must be scaled laterally to smaller dimensions.

As the bit dimension shrinks, however, three problems occur. First, the switching field increases for a given shape and film thickness, requiring more current to switch. Second, the total switching volume is reduced so that the energy barrier for reversal, which is proportional to volume and switching field, drops. The energy barrier refers to the amount of energy needed to switch the magnetic moment vector from one state to the other. The energy barrier determines the data retention and error rate of the MRAM device and unintended reversals can occur due to thermal fluctuations if the barrier is too small. Finally, because the switching field is produced by shape, the switching field becomes more sensitive to shape variations as the bit shrinks in size. With photolithography scaling becoming more difficult at smaller dimensions, MRAM devices will have difficulty maintaining tight switching distributions.

Accordingly, it is an object of the present invention to provide a new and improved magnetoresistive random access memory device which can store multiple states.

SUMMARY OF THE INVENTION

To achieve the objects and advantages specified above and others, a multi-state MRAM cell is disclosed. In the preferred embodiment, the multi-state MRAM cell has a resistance and includes a multi-state MRAM device sandwiched therebetween a first conductive line and a base electrode. Further, a second conductive line is positioned proximate to the base electrode. In the preferred embodiment, the multi-state MRAM device includes a pinned synthetic anti-ferromagnetic region positioned adjacent to the base electrode. The pinned synthetic anti-ferromagnetic region includes an anti-ferromagnetic pinning layer and a pinned ferromagnetic layer which has a pinned magnetic moment vector oriented in a preferred direction at a first nonzero angle relative to the first conductive line. Further, a non-ferromagnetic spacer layer is positioned on the pinned synthetic anti-ferromagnetic region.

A free ferromagnetic region is positioned on the non-ferromagnetic spacer layer and adjacent to the second conductive line. The free ferromagnetic region has a free magnetic moment vector that is free to rotate in the presence of an applied magnetic field and, in the preferred embodiment, has a shape designed to allow more than two, e.g. four, stable states, as will be discussed presently.

In the preferred embodiment, the free magnetoresistive region includes a tri-layer structure that includes an anti-ferromagnetic coupling spacer layer sandwiched therebetween two ferromagnetic layers. Further, the purpose of the first conductive line is to act as a bit line and the purpose of the second conductive line is to act as a switch line. These conductive lines supply current pulses to the MRAM device to induce a magnetic field for aligning the free magnetic moment vector in a desired state.

The multiple states of the MRAM device are created by an induced anisotropy within the free ferromagnetic region. In the preferred embodiment, the shape of the free ferromagnetic region is chosen to create multiple magnetic states wherein a first hard axis is oriented parallel with the first conductive region and a second hard axis is oriented parallel with the second conductive region. Consequently, the free magnetic moment vector will not be stable in either of these two directions.

Also, in the preferred embodiment, the shape of the free ferromagnetic region is chosen so that a first easy axis and a second easy axis are both oriented at nonzero angles to the first hard axis, the second hard axis, and the pinned magnetic moment vector. The first easy axis and the second easy axis are also chosen to be oriented at a 90° angle relative to each other. The first easy axis creates a first stable position and a third stable position wherein the first stable position and the third stable position are oriented anti-parallel along the first easy axis. The second easy axis creates a second stable position and a fourth stable position wherein the second stable position and the fourth stable position are oriented anti-parallel along the second easy axis.

Thus, in the preferred embodiment, four stable positions have been created by the shape induced anisotropy of the free ferromagnetic region. However, it will be understood that other methods can be used to create more than two stable positions in the free ferromagnetic region. Further, the resistance of the MRAM device depends on which stable position the free magnetic moment vector is aligned with because each stable position is oriented at a unique angle relative to the pinned magnetic moment vector. Hence, the four stable positions can be measured by measuring the resistance of the MRAM device.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
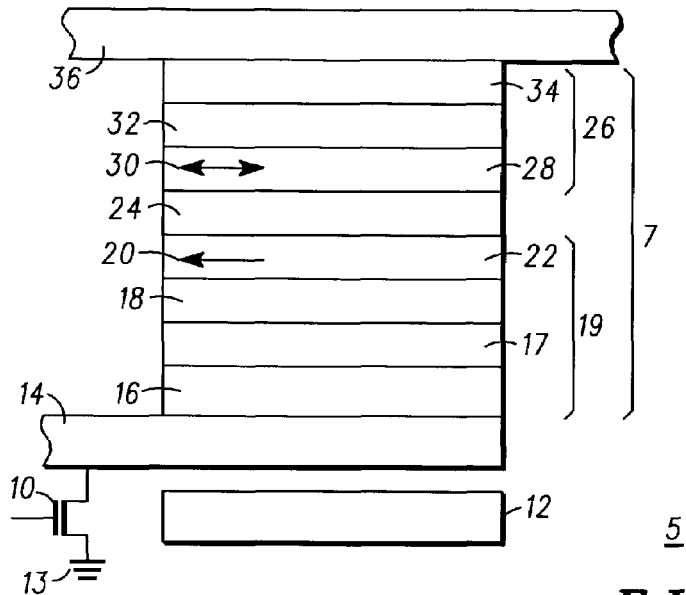
FIG. 1 is a sectional view of a multi-state magnetoresistive random access memory device in accordance with the present invention.

Turn now to FIG. 1, which illustrates a simplified sectional view of a multi-state MRAM cell 5 in accordance with the present invention. Multi-state MRAM cell 5 includes a multi-state MRAM device 7 sandwiched therebetween a base electrode 14 and a conductive line 36 wherein multi-state MRAM device 7 has a resistance, R. Further, a conductive line 12 is positioned proximate to base electrode 14 and an isolation transistor 10 is electrically connected to base electrode 14 and an electrical ground 13 as illustrated.

Multi-state MRAM device 7 includes a pinned synthetic anti-ferromagnetic region 19 positioned adjacent to base electrode 14. Pinned synthetic anti-ferromagnetic region 19 includes an anti-ferromagnetic pinning layer 16 positioned on base electrode 14, a pinned ferromagnetic layer 17 positioned on layer 16, an anti-ferromagnetic coupling layer 18 positioned on layer 17, and a fixed ferromagnetic layer 22 positioned on layer 18. Further, fixed ferromagnetic layer 22 has a fixed magnetic moment vector 20 oriented in a fixed preferred direction (see FIG. 3) at a first nonzero angle relative to conductive line 36. It will be understood that region 19 can be substituted by many configurations, including using a single fixed layer, and the use of four layers in this embodiment is for illustrative purposes only.

A non-ferromagnetic spacer layer 24 with a thickness is positioned on pinned synthetic anti-ferromagnetic region 19. It will be understood that non-ferromagnetic spacer layer 24 can include multiple layers, but is shown as one layer for illustrative purposes. Also, it will be understood that non-ferromagnetic spacer layer 24 can include a dielectric material, such as aluminum oxide (AlO), wherein multi-state MRAM device 7 behaves as a tunneling junction device. Layer 24 is typically thin enough to allow a spin polarized tunneling current to flow between fixed ferromagnetic layer 22 and ferromagnetic layer 28. In other embodiments, non-ferromagnetic spacer layer 24 can include a conductive material, such as copper (Cu), wherein multi-state MRAM device 7 behaves as a giant magnetoresistive device. In general, however, non-ferromagnetic spacer layer 24 can include any suitable non-ferromagnetic material which results in a device with a substantial magnetoresistive ratio.

A free ferromagnetic region 26 is positioned on non-ferromagnetic spacer layer 24 and adjacent to conductive line 36. Ferromagnetic layer 28 has a free magnetic moment vector 30 that is free to rotate in the presence of an applied magnetic field. In the preferred embodiment, free ferromagnetic region 26 is designed to provide free magnetic moment vector 30 with more than two stable positions, as will be discussed presently. In the preferred embodiment, free magnetoresistive region 26 includes a tri-layer structure that includes an anti-ferromagnetic coupling spacer layer 32 sandwiched therebetween a ferromagnetic layer 28 and a ferromagnetic layer 34.

It will be understood that free magnetoresistive region 26 can include more than three layers and that the use of three layers in this embodiment is for illustrative purposes only. For example, a five-layer stack of a ferromagnetic layer/anti-ferromagnetic coupling spacer layer/ferromagnetic layer/anti-ferromagnetic coupling spacer layer/ferromagnetic layer could also be used. Further, it will be understood that region 26 could include less than three layers such as a single free ferromagnetic layer.

Figure 5:
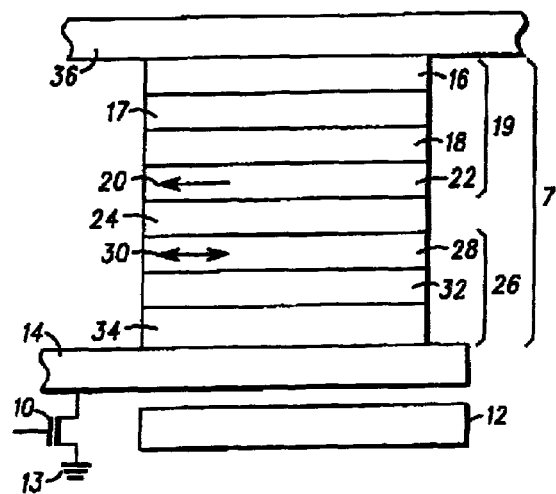
FIG. 5 is a section view of another embodiment of a multi-state magnetoresistive random access memory device in accordance with another embodiment.

It will also be understood that the free ferromagnetic layer 26 and the pinned synthetic anti-ferromagnetic layer 19 can have their positions exchanged in multi-state MRAM device 7 (See FIG. 5). The free ferromagnetic layer 26 would be positioned on the base electrode 14, the non-ferromagnetic spacer layer 24 would be positioned on the free ferromagnetic layer 26, and the pinned synthetic anti-ferromagnetic layer 19 would be positioned between the non-ferromagnetic spacer layer 24 and the conductive line 36.

In the preferred embodiment, pinned ferromagnetic layer 22 and ferromagnetic layer 28 have a split band structure with respect to electron spin that causes polarization of the conduction band electrons. In general, any material with a split band structure resulting in spin polarization of the conduction band electrons can be included in layers 22 and 28. The spin polarization of these materials results in a device structure that depends on the relative orientation of magnetic moment vectors 20 and 30. Further, in some embodiments, at least one of fixed ferromagnetic layer 22 and free ferromagnetic layer 28 can include half-metallic materials. It is well known to those skilled in the art that half-metallic materials ideally have 100% spin polarization, but in practice typically have at least 80% spin polarization. The use of half-metallic materials greatly increases a signal-to-noise ratio of multi-state MRAM cell 5.

Figure 2:
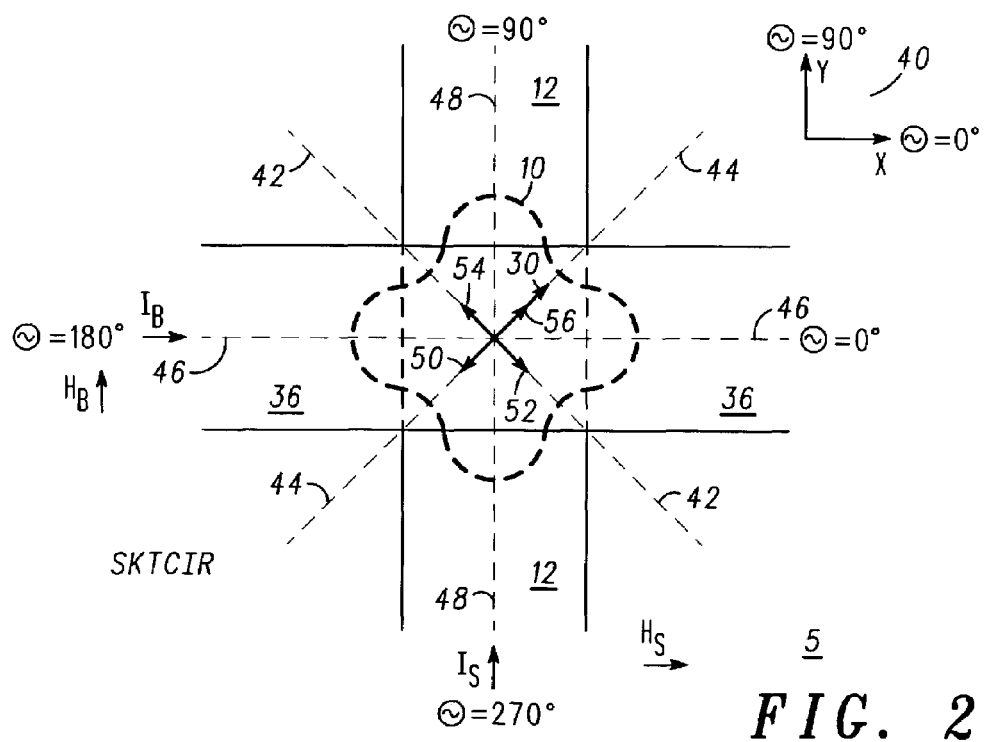
FIG. 2 is plan view of the multi-state magnetoresistive random access memory device illustrated in FIG. 1 in accordance with the present invention.

Turn now to FIG. 2 which illustrates a simplified plan view of multi-state MRAM cell 5. To simplify the description of the operation of multi-state MRAM device 7, all directions will be referenced to an x- and y-coordinate system 40 as shown. In coordinate system 40, an angle θ is defined to be 0° along the positive x-axis, 90° along the positive y-axis, 180° along the negative x-axis, and 270° along the negative y-axis.

Further, in the preferred embodiment, a bit current, $I_B$, is defined as being positive if flowing in the positive x-direction and a switch current, $I_S$, is defined as being positive if flowing in the positive y-direction. The purpose of conductive line 12 and conductive line 36 is to create a magnetic field that acts upon multi-state MRAM device 7. Positive bit current, $I_B$, will induce a circumferential bit magnetic field, $H_B$, and positive switch current, $I_S$, will induce a circumferential switch magnetic field, $H_S$. Since conductive line 36 is above multi-state MRAM device 7, in the plane of the element, $H_B$ will be applied to multi-state MRAM device 7 in the positive y-direction for positive bit current, $I_B$. Similarly, since conductive line 12 is positioned below multi-state MRAM device 7, in the plane of the element, $H_S$ will be applied to multi-state MRAM device 7 in the positive x-direction for positive switch current, $I_S$.

It will be understood that the definitions for positive and negative current flow are arbitrary and are defined here for illustrative purposes and convenience. The effect of reversing the current flow is to change the direction of the magnetic field induced within multi-state MRAM device 7. The behavior of a current induced magnetic field is well known to those skilled in the art and will not be elaborated upon further here.

As discussed previously, free ferromagnetic region 26 is designed to provide free magnetic moment vector 30 with more than two stable positions. One method to create more than two stable positions is to manipulate the shape of free ferromagnetic region 26. For example, in one embodiment, free ferromagnetic region 26 can have a shape that is defined by a polar equation given as $r(\theta)=1+|A \cdot \cos(N \cdot \theta - \alpha)|$, wherein N is approximately half the number of stable positions and is a whole number greater than one, $\theta$ is an angle relative to conductive lines 12 and 36, r is a distance in polar coordinates that is a function of the angle $\theta$ in degrees, $\alpha$ is an angle in degrees that determines the angle of the lobes with respect to conductive line 12, and A is a constant. The angle $\theta$ has continuous values in the range between 0° and 360° and, in this embodiment, the constant A has a value between 0.1 and 2.0.

In the preferred embodiment, the equation for polar function $r(\theta)$ is chosen so that at least one lobe is oriented parallel with conductive line 12 (i.e. $\theta=90°$). It will be understood that polar function $r(\theta)$ traces out the outer edge of free ferromagnetic region 26 to illustrate the basic shape of the region and not the dimensions. Also, it will be understood that other equations are possible to describe the basic shape and that other shapes are possible to induce a shape anisotropy that creates more than two stable states.

In general, however, other methods of inducing an anisotropy could be used alone or in combination with shape anisotropy. For example, an intrinsic anisotropy of a magnetic material included in free ferromagnetic region 26, generally thought to arise from atomic-level pair ordering, can be used. Also, the direction of the intrinsic anisotropy can be set by applying a magnetic field during deposition of free ferromagnetic region 26 or during a post deposition anneal. A magnetocrystalline anisotropy of the magnetic material included in free ferromagnetic region 26 could also be used by growing a magnetic material with a preferred crystalline orientation. Further, an anisotropy induced by certain anisotropic film growth methods could also be used to induce an anisotropy wherein the induced anisotropy is thought to originate from a shape asymmetry of the growing clusters or crystallites.

However, it will be understood that in the preferred embodiment, the anisotropy of free ferromagnetic region 26 is created by a shape anisotropy. A shape anisotropy is used in the preferred embodiment for illustrative purposes only and it will be understood that other methods are available to create an anisotropy, and, consequently, more than two stable states in free ferromagnetic region 26.

In the preferred embodiment, it is assumed that multi-state MRAM cell 5 illustrated in FIG. 2 has four stable states wherein N is equal to four, A is equal to 0.5, and $\alpha$ is equal to 180°, and that the four stable states are created by the shape anisotropy of free ferromagnetic region 26. Further, it is assumed that the shape of free magnetoresistive region 26 induces an easy axis 44 and an easy axis 42 which are oriented at a nonzero angle relative to one another, wherein the nonzero angle is 90° in the preferred embodiment. Further, easy axis 44 and easy axis 42 are oriented at a nonzero angle relative to pinned magnetic moment vector 20 (not shown), conductive line 36, and conductive line 12.

Also in the preferred embodiment, it is assumed that the shape of free magnetoresistive region 26 induces a hard axis 46 and a hard axis 48 wherein hard axis 46 is oriented parallel to conductive line 36 and hard axis 48 is oriented parallel to conductive line 12. It will be understood that the magnetization directions of the stable states may be complex, with the magnetization bending or curling to minimize its energy, but it is assumed for illustrative purposes that the magnetization directions in this embodiment are oriented 90° apart along easy axes 42 and 44, as discussed above.

Further, it will be understood that the magnetization is not generally uniform in the same direction over the area of the bit, but is assumed to be uniform in this embodiment for simplicity. Thus, for simplicity, the easy axis is defined as being an axis which is oriented with a center of MRAM cell 5 when the magnetic moment vector is in a stable rest state.

In this embodiment, easy axis 44 creates a stable position 50 and a stable position 56 and easy axis 42 creates a stable position 52 and a stable position 54. Hence, stable position 54 is oriented 90° relative to stable position 56, stable position 50 is oriented 180° relative to stable position 56, and stable position 52 is oriented 270° relative to stable position 56. Thus, in this embodiment, four stable positions have been created in free magnetoresistive region 26 for free magnetic moment vector 30 to align with. It will be understood that the angles between adjacent stable positions are chosen to be 90° for illustrative purposes and other angles could be chosen.

Figure 3:
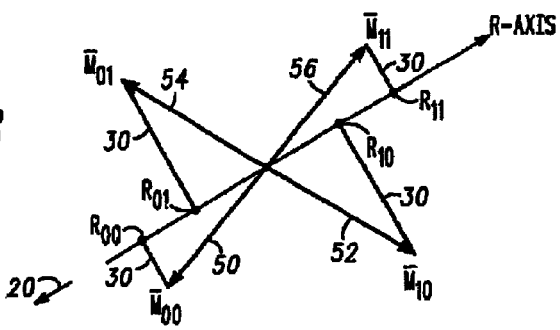
FIG. 3 is a graph illustrating the resistance values of a multi-state magnetoresistive random access memory device in the various states.

The relationships between free magnetic moment vector 30 and the resistance are illustrated in graph 81 in FIG. 3 where free magnetic moment vector 30 is shown oriented in stable positions 50, 52, 54, and 56 along a R-axis. The R-axis is defined as a resistance axis directed anti-parallel with the direction of pinned magnetic moment vector 20.

Resistance, R, of multi-state MRAM cell 5 depends on the position of free magnetic moment vector 30 relative to pinned magnetic moment vector 20. It is well known by those skilled in the art that the resistance of a magnetoresistive device, such as a magnetic tunnel junction or a spin valve device, varies between a minimum value, $R_{min}$, and a maximum value, $R_{max}$, by approximately as the cosine of an angle, $\phi$, between magnetic moment vectors 20 and 30 according to the relationship given as $$R \approx \frac{1}{2}(R_{min} + R_{max}) - \frac{1}{2}(R_{max} - R_{min})\cos(\phi).$$

R is at its maximum value, $R_{max}$, when vectors 20 and 30 are anti-parallel (i.e. $\phi=180°$) so that $\cos(\phi)=-1$. R is at its minimum value, $R_{min}$, when vectors 20 and 30 are parallel (i.e. $\phi=0°$) so that $\cos(\phi)=1$. It is further understood by those skilled in the art that if one of layers 22 or 28 has an opposite polarization of the conduction electrons then the principles of the device are unchanged, but the sign of the cosine dependence is opposite. This mathematical cosine relationship is shown graphically as the projection of the magnetic moment vector 20 on the R-axis in graph 81.

In the preferred embodiment, R has a value $R_{11}$ when free magnetic moment vector 30 is in stable position 56, a value $R_{01}$ when free magnetic moment vector 30 is held in stable position 54, a value $R_{00}$ when free magnetic moment vector is held in stable position 50, and a value $R_{10}$ when free magnetic moment vector is held in stable position 52. Further, it will be understood that in this illustration $R_{00} < R_{01} < R_{10} < R_{11}$.

For example, if free magnetic moment vector 30 is oriented in stable position 50, then multi-state MRAM device 7 has a resistance value of $R_{00}$, which is the projection of free magnetic moment vector 30 in stable position 50 onto the R-axis. Similarly, the projections of magnetic moment vector 30 in stable positions 52, 54, and 56 have corresponding resistance values of $R_{10}$, $R_{01}$, and $R_{11}$, respectively. Thus, the state of multi-state MRAM device 7 can be read by measuring its resistance.

The method of writing to multi-state MRAM cell 5 involves supplying currents in conductive line 12 and conductive line 36 such that free magnetic moment vector 30 can be oriented in one of four stable positions in the preferred embodiment. To fully elucidate the writing method, specific examples describing the time evolution of circumferential bit magnetic field, $H_B$, and circumferential switch magnetic field, $H_S$, are now given.

Figure 4:
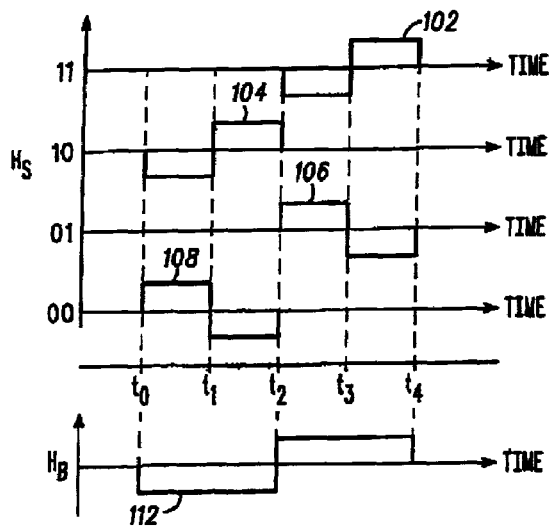
FIG. 4 is a graph illustrating the various current pulses used to write to a multistate magnetoresistive random access memory device.

Turn now to FIG. 4 which illustrates a magnetic pulse sequence 100. Illustrated are the magnetic pulse sequences used to write multi-state MRAM cell 5 to various states. The writing method involves applying current pulses in conductive line 12 and conductive line 36 to rotate free magnetic moment vector 30 in a direction parallel to one of the four stable positions in the preferred embodiment. The current pulses are then turned off so that free magnetic moment vector 30 is aligned in one of the four stable positions.

It will be understood that for a memory array one can arrange a plurality of MRAM cells on a grid with lines 12 and 36 electrically connected to an array of cells arranged in rows and columns to form a cross point array. With multi-state MRAM cells, as with conventional two state MRAM cells, the bits ideally must not switch when exposed to a field generated by a single conductive line. It is desired to have only the bit which is at the cross-point of two active conductive lines be switched.

In the preferred embodiment, MRAM cell 5 requires a much higher magnetic field to switch 180° compared to 90°. The currents used for writing are designed to generate magnetic fields that are above the threshold for 90° switching but below the threshold required for 180° switching. In this way a sequence of current pulses can be applied to the lines that will switch only the MRAM cell at the cross-point and will move its magnetic moment vector in a sequence of 0° and/or 90° switches until it reaches the desired final state regardless of the initial state.

In FIG. 4, for example, the longer pulses of $H_B$ determine if the final state will be in the negative or positive y-direction while the bipolar pulse of $H_S$ determines if the final state will be in the positive or negative x-direction. Due to the symmetry of MRAM cell 5, an equivalent writing scheme can be constructed by reversing the roles of $H_S$ and $H_B$ so that $H_S$ pulses are long and $H_B$ pulses are short and bipolar. If $\delta$ is the duration of a short pulse, $\delta = t_{i+1} - t_i$, then the total duration of the write cycle shown in FIG. 4 is $4 \cdot \delta$. Since the active part of the cycle for any given bit is only the part of the cycle with the bipolar pulses on $H_S$, the same result could be obtained with slightly different write circuitry that only executes the active part of the cycle needed to write the desired state. Thus the total cycle time can be reduced to $2 \cdot \delta$.

It is understood by those skilled in the art that the current pulses in a circuit may have variations in shape and duration, such as finite rise time, overshoot, and finite separation between pulses and therefore may not appear exactly as illustrated in FIG. 4.

One principle of operation in writing to MRAM cell 5 is having a single long pulse on one conductive line coincident with a bipolar pulse on another conductive line to move the magnetic moment of the MRAM bit to the desired state. In particular, a finite separation between the current pulses may be desirable so that the magnetic state of the free layer moves to an equilibrium state before the beginning of the next current pulse.

For example, by using a magnetic pulse sequence 102 for $H_S$ and a magnetic pulse sequence 112 for $H_B$, multi-state MRAM cell is written into a '11' state. In particular, at a time $t_0$, $H_B$ is pulsed to a negative value while $H_S$ is zero. Since only one write line is on, the magnetic moment of the MRAM bit will not change states.

At a time $t_2$, $H_B$ is pulsed to a positive value while $H_S$ is pulsed to a negative value. If the initial state was in direction 56 or 50, then this will cause a 90 rotation of the magnetic moment direction 54. If the initial state is 54 or 52, then there will be no rotation. At a time $t_3$ when the negative $H_S$ pulse is complete, the bit can only be oriented with its magnetic moment substantially along axis 42 in FIG. 2. At time $t_3$, $H_B$ is kept at its positive value while $H_S$ is pulsed to a positive value. This has the effect of orienting free magnetic moment vector 30 toward direction 56. At a time $t_4$, $H_B$ and $H_S$ are both made zero so a magnetic field force is not acting upon free magnetic moment vector 30 and the moment settles into equilibrium position 56. It will be understood that in this illustration $t_0 < t_1 < t_2 < t_3 < t_4$.

Consequently, free magnetic moment vector 30 will become oriented in the nearest stable position to minimize the anisotropy energy, which in this case is stable position 56. As discussed previously and illustrated graphically in FIG. 3, stable position 56 is defined as the '11' state. Hence, multi-state MRAM cell 5 has been programmed to store a '11' by using magnetic pulse sequences 102 and 112. Similarly, multi-state MRAM cell 5 can be programmed to store a '10' by using magnetic pulse sequences 104 and 112, to store a '01' by using magnetic pulse sequences 106 and 112, and to store a '00' by using magnetic pulse sequences 108 and 112. It will be understood that the states used in this illustration are arbitrary and could be otherwise defined.

Thus, multi-state MRAM cell 5 can be programmed to store multiple states without decreasing the dimensions of multi-state MRAM cell 5. Consequently, in the preferred embodiment, the memory storage density is increased by a factor of two. Also, a writing method has been demonstrated in the preferred embodiment so that one of four possible states can be stored in the MRAM device regardless of the initial stored state.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A multi-state magnetoresistive random access memory device having a resistance, the device comprising:
    a substrate;
    a first conductive line positioned on the substrate;
    a fixed ferromagnetic region positioned proximate to the first conductive line, the fixed ferromagnetic region having a fixed magnetic moment vector fixed in a preferred direction both with and without an applied magnetic field;
    a non-ferromagnetic spacer layer positioned on the fixed ferromagnetic region;
    a free ferromagnetic region positioned on the non-ferromagnetic spacer layer, the free ferromagnetic region having a free magnetic moment vector that is free to rotate in the presence of an applied magnetic field and where the free ferromagnetic region has an anisotropy that creates more than two stable positions for the free magnetic moment vector wherein the more than two stable positions are oriented relative to the preferred direction of the fixed magnetic moment vector such that each position produces a unique resistance; and
    a second conductive line positioned at a non-zero angle to the first conductive line.

2. An apparatus as claimed in claim 1 wherein the anisotropy of the free ferromagnetic region is created by the shape of the free ferromagnetic region.

3. An apparatus as claimed in claim 2 wherein the shape of the free ferromagnetic region is defined approximately by a polar equation given as $r(\theta)=1+|A \cdot \cos(N \cdot \theta - \alpha)|$, wherein N is a whole number, $\theta$ is an angle in degrees relative to the first and second conductive lines, r is a distance in polar coordinates that is a function of the angle $\theta$, $\alpha$ is an angle in degrees that determines the angle of the lobes relative to the first conductive line, and A is a constant.

4. An apparatus as claimed in claim 3 wherein the constant A has a value between 0.1 and 2.0.

5. An apparatus as claimed in claim 2 wherein the shape of the free ferromagnetic layer has at least one lobe oriented parallel to the first conductive line.

6. An apparatus as claimed in claim 3 wherein the angle $\theta$ has continuous values in the range between 0° and 360°.

7. An apparatus as claimed in claim 1 wherein at least one of the pinned ferromagnetic region and the free ferromagnetic region includes one of iron oxide ($Fe_3O_4$), chromium oxide ($CrO_2$), oxides, and semiconductors, wherein the oxides and semiconductors are doped with one or more of iron, cobalt, nickel, magnesium, and chromium.

8. An apparatus as claimed in claim 1 wherein the anisotropy of the free ferromagnetic region is created by an intrinsic anisotropy of a material included in the free ferromagnetic region.

9. An apparatus as claimed in claim 8 wherein the intrinsic anisotropy is created by applying a magnetic field to the free ferromagnetic region.

10. An apparatus as claimed in claim 1 wherein the anisotropy of the free ferromagnetic region is created by growing the free ferromagnetic region with a preferred crystalline orientation.

11. An apparatus as claimed in claim 1 wherein the anisotropy of the free ferromagnetic region is created by growing the free ferromagnetic region with clusters or crystallites that have a shape anisotropy.

12. An apparatus as claimed in claim 1 wherein the more than two stable positions are oriented at a nonzero angle relative to the first and second conductive lines.

13. An apparatus as claimed in claim 1 wherein the magnetic moment of the fixed ferromagnetic region is at a non-zero angle relative to the first and second conductive lines.

14. An apparatus as claimed in claim 1 wherein the stable positions are induced by a shape anisotropy of the free ferromagnetic region.

15. An apparatus as claimed in claim 1 wherein the anisotropy of the free ferromagnetic region is created by the free ferromagnetic region having clusters or crystallites that have a shape anisotropy.

16. A multi-state magnetoresistive random access memory device comprising:
    a substrate;
    a first conductive line positioned proximate to the base electrode;
    a free ferromagnetic region positioned proximate to the first conductive line, the free ferromagnetic region having a free magnetic moment vector that is free to rotate in the presence of an applied magnetic field and where the free ferromagnetic region has an anisotropy that creates more than two stable positions for the free magnetic moment vector wherein the more than two stable positions are oriented relative to the preferred direction of the fixed magnetic moment vector such that each position produces a unique resistance;
    a non-ferromagnetic spacer layer positioned on the free ferromagnetic region;
    a fixed ferromagnetic region positioned on the non-ferromagnetic spacer layer, the fixed ferromagnetic region having a fixed magnetic moment vector fixed in a preferred direction both with and without an applied magnetic field; and a second conductive line positioned at a non-zero angle to the first conductive line.

17. An apparatus as claimed in claim 16 wherein the shape of the free ferromagnetic layer has at least one lobe oriented parallel to the first conductive line.

18. An apparatus as claimed in claim 14 wherein the shape of the free ferromagnetic region is defined approximately by a polar equation given as $r(\theta)=1+|A\cdot\cos(N\cdot\theta-\alpha)|$, wherein N is a whole number, $\theta$ is an angle in degrees relative to the first and second conductive lines, r is a distance in polar coordinates that is a function of the angle $\theta$, $\alpha$ is an angle in degrees that determines the angle of the lobes relative to the first conductive line, and A is a constant.

19. An apparatus as claimed in claim 18 wherein the constant A has a value between 0.1 and 2.0.

20. An apparatus as claimed in claim 18 wherein the angle $\theta$ has continuous values in the range between 0° and 360°.

21. An apparatus as claimed in claim 18 wherein the stable positions are induced by a shape anisotropy of the free ferromagnetic region.

22. An apparatus as claimed in claim 18 wherein the number of stable positions is equal to four.

23. An apparatus as claimed in claim 16 wherein the anisotropy of the free ferromagnetic region is created by an intrinsic anisotropy of a material included in the free ferromagnetic region.

24. An apparatus as claimed in claim 23 wherein the intrinsic anisotropy is created by applying a magnetic field to the free ferromagnetic region.

25. An apparatus as claimed in claim 16 wherein the anisotropy of the free ferromagnetic region is created by growing the free ferromagnetic region with a preferred crystalline orientation.

26. An apparatus as claimed in claim 16 wherein the anisotropy of the free ferromagnetic region is created by growing the free ferromagnetic region with clusters or crystallites that have a shape anisotropy.

27. An apparatus as claimed in claim 16 wherein at least one of the pinned ferromagnetic region and the free ferromagnetic region includes one of iron oxide ($Fe_3O_4$), chromium oxide ($CrO_2$), oxides, and semiconductors, wherein the oxides and semiconductors are doped with one or more of iron, cobalt nickel, magnesium, and chromium.

28. An apparatus as claimed in claim 16 wherein the non-ferromagnetic spacer layer includes one of a dielectric-material, such as aluminum oxide, and a conductive material such as copper.

29. An apparatus as claimed in claim 16 wherein the more than two stable positions are oriented at a nonzero angle relative to the first and second conductive lines.

* * * * *